United States Patent

[11] 3,584,268

[72] Inventor Fred William Schmidlin
Pittsford, N.Y.
[21] Appl. No. 620,319
[22] Filed Mar. 3, 1967
[45] Patented June 1, 1971
[73] Assignee Xerox Corporation
Rochester, N.Y.

[54] INVERTED SPACE CHARGE LIMITED TRIODE
6 Claims, 1 Drawing Fig.

[52] U.S. Cl. .......... 317/235, 317/237, 148/1.5
[51] Int. Cl. .......... H01l 11/00
[50] Field of Search .......... 317/237, 40, 40.13, 22

[56] References Cited

UNITED STATES PATENTS

| | | | |
|---|---|---|---|
| 2,721,965 | 10/1955 | Hall | 317/235 |
| 2,924,760 | 2/1960 | Herlet | 317/235 |
| 3,186,879 | 6/1965 | Schnable | 148/1.5 |
| 3,225,272 | 12/1965 | Cronemeyer | 317/235 |
| 3,271,640 | 9/1966 | Moore | 317/235 |
| 3,287,610 | 11/1966 | Reber | 317/234 |
| 3,304,471 | 2/1967 | Zuleeg | 317/237 |

*Primary Examiner*—John W. Huckert
*Assistant Examiner*—Simon Broder
*Attorneys*—Frank A. Steinhilper, Stanley Z. Cole and Ronald Zibelli

ABSTRACT: This disclosure is directed toward a method of fabricating an inverted space charge limited solid-state triode and to the device resulting therefrom. The method, in general, comprises depositing a continuous film of conductive metal to act as a gate, oxidizing the exposed side of the gate metal to form an insulating layer, depositing a semiconductive layer on the top of the insulated gate, depositing a pinhole cathode grid on the semiconductor, oxidizing the exposed side of the cathode grid to form an insulating coating, depositing more semiconductor over the cathode insulation and depositing a continuous film of conductive metal over the semiconductor to act as a collector.

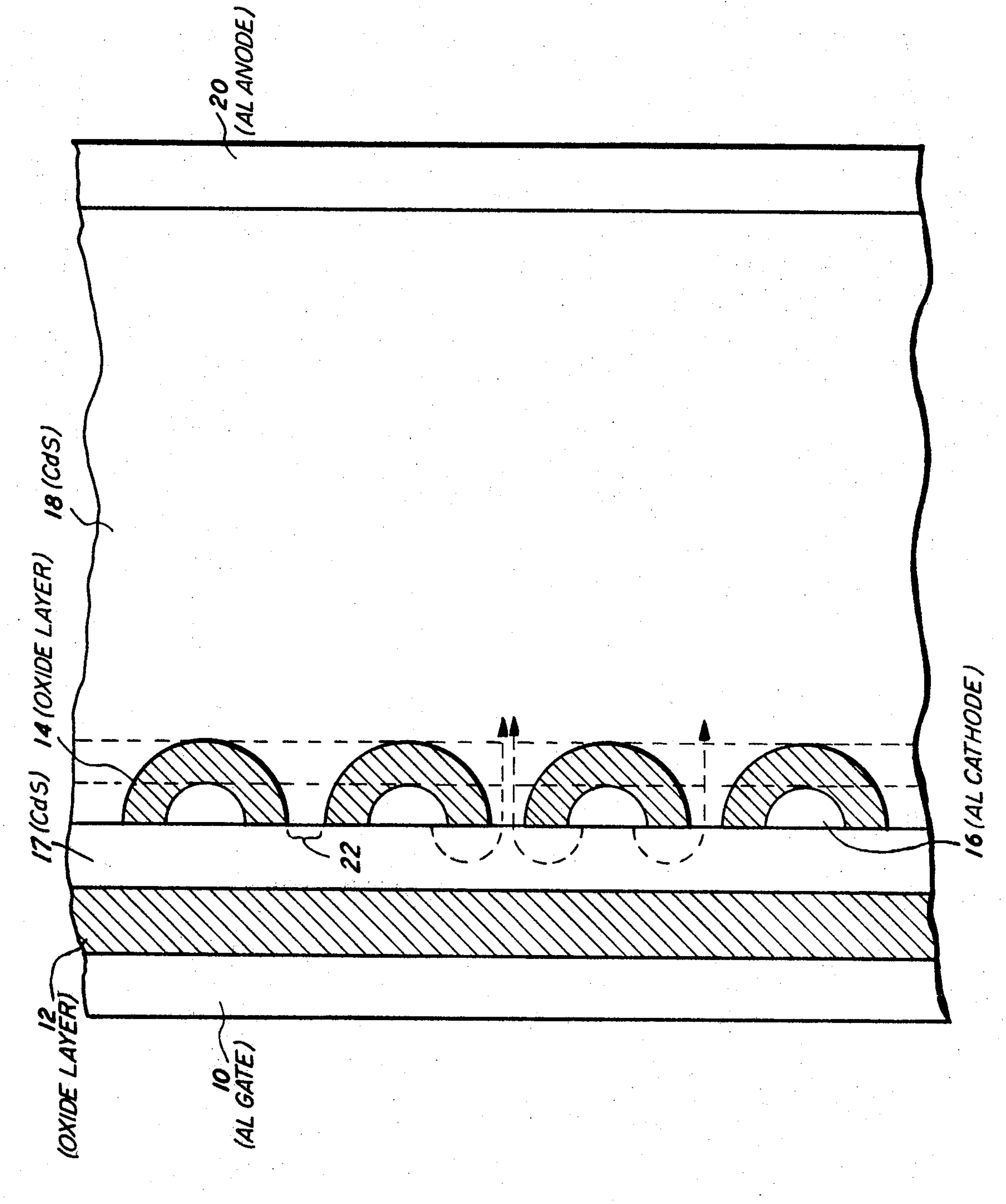
INVENTOR.
FRED W. SCHMIDLIN
BY
Ronald Zibelli
ATTORNEYS

INVERTED SPACE CHARGE LIMITED TRIODE

BACKGROUND OF THE INVENTION

This invention relates to solid-state active devices and more particularly to thin-film elements such as space charge limited triodes and their methods of production.

The mechanism of space charge limited currents in solids has been discussed in the prior art. For example, see G. T. Wright, "Mechanisms of Space-Charge-Limited Current in Solids," *Solid State Electronics*, Pergamon Press, 1961, Vol. 2, pp. 165—189. Further, the concept of using solid-state diodes and triodes similar to vacuum diodes and triodes has also, been discussed extensively in the prior art. For example, see G. T. Wright, "Space-Charge-Limited Solid-State Devices," *Proceedings of the IEEE*, Vol. 51, pp. 1642—52, Nov. 1963 and the articles cited therein. The possibility of economical production of such solid-state devices is particularly attractive when considered in connection with the formation of integrated circuits, a part or all of which may be deposited from the vapor state.

Among the advantages which have been considered in connection with space charge limited triodes is the fact that in such an element the electrons travel from source to drain without having to go through a base metal which eliminates uncertainities concerning reflection losses and other energy losses in the base region. Further, a space charge limited triode can have high input impedance and thus may find use in a different class of circuits from hot electron devices. Also, the variation of characteristics of such a solid-state device may be much less than in, for example, a metal base transistor. A space charge limited emission is inherently less noisy than other transistors or hot electron devices with comparable maximum operating frequencies.

In spite of the many advantages inherent in a space charge limited triode the difficulties associated with inserting an insulated metal grid or control electrode within a solid-state device have hindered their development.

The prior art in this area has suffered from an inability to solve the problem of inserting a suitable control element in a solid-state device directly and a great deal of difficulty has been experienced in attempting to find suitable methods to fabricate such a device indirectly.

One approach is the fabrication of a structure known as an inverted space charge limited triode. In this device the source or cathode lies between the gate and the anode which makes the device easier to make than the noninverted structure and is more suitable for certain applications. However, while simpler to make than the noninverted form of the triode, the prior attempts at fabrication of an inverted space charge limited triode have proved cumbersome and complex. In some cases difficulty in producing both ohmic and blocking contacts on the same transport medium have led to the tedious task of synthesizing graded transport structures consisting of two or more compounds.

SUMMARY OF THE INVENTION

Accordingly it is an object of the present invention to provide a new and highly effective inverted space charge limited triode device and method for its fabrication which overcome the deficiencies of the prior art as described above.

It is a further object of this invention to provide a method of constructing space charge limited solid-state elements which are capable of acting as triodes.

It is another object of the present invention to provide a method of constructing a solid-state triode adaptable for incorporation in integrated circuitry.

A further object of the present invention is to provide a solid-state device which is readily constructed using vacuum deposition techniques.

Other objects and a fuller understanding of the present invention may be had by referring to the following description and claims taken in conjunction with the accompanying drawing.

The present invention overcomes the deficiencies of the prior art and achieves its objectives by utilizing an insulating gate which leads to great simplification in the heretofore complex fabrication processes utilized in the construction of inverted space charge limited triodes while maintaining all of the advantages such as noted above.

BRIEF DESCRIPTION OF THE DRAWING

In order to facilitate understanding of this invention reference will now be made to the appended drawing of a preferred embodiment of the present invention. The drawing should not be construed as limiting the invention but is exemplary only.

The FIGURE is a much enlarged partial cross section of a solid-state device constructed in accordance with the present invention.

DESCRIPTION OF THE PREFERRED EMBODIMENT

The preferred embodiment of the present invention shown in the FIGURE consists of a gate structure 10 which is a continuous metallic film of suitable conductive material such as aluminum. The gate layer 10 may be initially deposited upon a separate inert material substrate such as glass or the like but such substrate (not shown) may be eliminated if the device is self-supporting.

An insulating layer of anodized oxide 12 covers one side of gate 10 to provide it with an electrically insulating layer. A layer of a suitable semiconducting material 17 such as cadmium sulfide separates the oxide insulating layer 12 from the cathode elements 16. The thickness of the semiconductor layer is on the order of hundreds of angstroms. The cathode structure 16 consists of a thin layer of metallic conductive material such as aluminum which has been deposited under such conditions so that it contains a large number of pinholes. The cathode is covered by a layer of insulative oxide 14 on one side produced by anodizing the cathode layer. Any suitable apertured cathode arrangement can be used with the device. For instance, in the partial cross-sectional view of the embodiment shown in the FIGURE, the dotted lines running transversely to the cathode elements 16 and layer 14 depict the cathode as having grid elements in two directions with apertures 22 therebetween. A suitable semiconductive material 18 such as cadmium sulfide fills in the pinholes between the cathode elements and provides a layer from one to several microns thick covering the cathode 16 and its oxidation layer 14. A collector or anode 20 consisting of a suitable metallic film such as aluminum covers the transport medium 18 and completes the structure. The FIGURE shows gate 10, cathode 16, and anode 20 made of aluminum and the two layers 17 and 18 of semiconductive material made of cadmium sulfide, however, it is intended that any suitable materials be employed in the device that is shown in the FIGURE.

It may be seen that the solid-state device shown in the FIGURE is the equivalent of a vacuum tube triode. The cathode 16 serves as a charge emitter in a preferential direction due to the presence of the oxide layer 14. The emitted charge carriers are initially directed to the gate 10 and are influenced in their behavior by the nature and extent of the potential applied to gate 10. The semiconductive layer between cathode 16 and gate 10 is equivalent to the cathode-grid spacing in a vacuum tube device while the semiconductive material 18 through which the charges travel from cathode 16 to anode 20 is equivalent to the vacuum space between anode and cathode in a vacuum tube device. The gate 10 acts in a manner equivalent to the grid in a vacuum triode serving to control the flow of charge carriers such as electrons or holes.

While aluminum has been referred to throughout as the preferred material for the anode, cathode and gate, other metals suitable for charge emission and collection may be used. Typical metals suitable for charge carrier processes include gold, silver, aluminum and their alloys. While the oxides of aluminum have been referred to throughout the discussion of the preferred embodiment as the preferred insulative material, oxides of other metals and any number of the well-known insulative materials may be utilized. Suitable semiconductors are by no means limited to the cadmium sulfide referred to in the preferred embodiment but any number of other suitable semiconductors including, but not limited to, compounds such as selenium, cadmium selenide, cadmium telluride, zinc sulfide, zinc selenide and zinc telluride.

Several operational and fabrication advantages are immediately apparent from the structure as shown in the preferred embodiment. Since an insulated gate 10 is employed, the complications encountered in the past associated with making graded junctions are avoided and the transport medium may now be homogeneous. Further, a wide choice of materials becomes available for the insulated gate. The number of materials which must be vapor deposited during fabrication may now be as few as two, namely a metal for the electrodes and a semiconductor for the transport medium. Since insulation is utilized over the gate, higher input impedances are now possible. To achieve devices with optimal characteristics is now possible if precautions are taken to make the oxide layer 14 on the cathode 16 at least as thick as the effective gate-cathode separation since this will permit the potential effective in the pinholes of the cathode 16 to be varied appreciably by the control gate 10. Since an element such as described above may typically have a thickness on the order of 10,000 angstroms, it provides a solid-state triode capable of being incorporated into an integrated circuit fabricated by vacuum deposition or other well-known techniques.

A typical procedure for fabricating an inverted space charge limited triode as shown in the preferred embodiment of the present invention is as follows. Using a cool substrate a continuous film of aluminum on the order of 1,000 angstroms in thickness is deposited to form the gate 10. Although vacuum deposition techniques are preferred, other methods and techniques of forming or depositing a metal film may be used, and these include sputtering, deposition by electrochemical processes and by the reduction of a metal by well known chemical processes. The gate 10 is then plasma anodized or oxidized to provide an insulative layer having a thickness of approximately 100 angstroms. A layer of cadmium sulfide from approximately 100 to 300 angstroms in thickness may then be deposited on top of the insulative gate under conditions to produce as uniformly thick a film as possible. The semiconductor may be applied by vacuum deposition, by the process of pyrolysis, by sputtering, or by a suitable electrochemical process. Over the layer of semiconductor a layer of aluminum approximately 1,500 angstroms thick is then deposited under conditions which will produce a large number of pinholes to form the cathode structure 16. Slow evaporation at elevated substrate temperatures may be utilized to produce adequate pinholes. Also, the vacuum deposition process of shadowing may be utilized to produce an adequate grid structure as well as other well known deposition techniques. A further possibility for the production of the controlled distribution of pinholes is the use of toner particles held onto the substrate electrostatically to act as a mask. Other more conventional masking and ruling techniques may also be utilized. The exposed side of the cathode structure is then plasma anodized or oxidized to a thickness of about 1,000 angstroms. The oxide layer of this thickness assures a source pinhole separation large compared to the source gate separation, thus assuring more effective charge control by the gate.

Over the cathode structure with its oxidized layer 14 is placed one to several microns of semiconductor such as cadmium sulfide by vacuum deposition to complete the transport medium. The transport medium is then covered by a continuous aluminum film deposited by vacuum deposition. This aluminum film or other metallic layer acts as the collector.

The thickness of the layers recited herein is exemplary only and may be varied to meet the requirements of varying applications.

It may be seen from the above discussion that the present invention provides a vastly simplified structure and method of making a solid-state device which has long been recognized as desirable but for which there was no means of construction which was not both tedious and cumbersome. This method provides the possibility of extending the application of this type of circuit element to the formation of large numbers of integrated circuits.

Although a specific preferred embodiment of the invention has been described in the detailed description above, the description is not intended to limit the invention to the particular forms or embodiments disclosed herein, since they are to be recognized as illustrative rather than restrictive, and it will be obvious to those skilled in the art that the invention is not so limited. The invention is declared to cover all changes and modifications of the specific example of the invention herein disclosed for purposes of illustration which do not constitute departures from the terms of the claims.

What I claim is:

1. A space charge limited solid-state triode comprising an assembly of elements in the following order:
   a. a metal gate,
   b. a first layer of insulating material on said gate,
   c. a first layer of semiconductive material on said first layer of insulating material,
   d. a cathode comprising an apertured metal grid on said first layer of semiconductive material,
   e. a second layer of that material surrounding said metal grid on all sides except that side facing said gate,
   f. a second layer of semiconductive material covering said second layer of insulating material and filling said apertures so that the second layer of semiconductive material is in contact with said first layer of semiconductive material at said apertures whereby said grid and said second layer of insulating material are surrounded by semiconductive material, and
   g. a metal anode on said second layer of semiconductive material.

2. The device of claim 1 wherein said second layer of insulating material surrounding said cathode grid is at least as thick as the effective gate-cathode separation.

3. The device of claim 1 wherein said cathode, anode, and gate metal is aluminum and wherein said first and second layers of insulating material comprise oxides of aluminum.

4. The device of claim 1 wherein said cathode, anode, and gate metal is aluminum and wherein said first and second layers of semiconductive material are cadmium sulfide.

5. The device of claim 2 wherein said cathode, anode and gate metal is aluminum and wherein said first and second layers of insulating material comprise oxides of aluminum and wherein said first and second layers of semiconductive material are cadmium sulfide.

6. A space charge limited solid-state triode comprising an assembly of elements in the following order:
   a. a metal gate,
   b. a first layer of insulating materials on said gate,
   c. a first layer of semiconductive material on said first layer of insulating material,
   d. a cathode adapted to emit charge carriers on said first layer of semiconductive material,
   e. a second layer of insulating material surrounding said cathode on all sides except that side facing said gate,
   f. a second layer of semiconductive material covering said second layer of insulating material and in contact with said first layer of semiconductive material whereby said cathode and said second layer of insulating material are surrounded by semiconductive material,
   g. a metal anode on said second layer of semiconductive material, and
   h. means to enable the charge carriers emitted by said cathode to migrate through the said layers of semiconductive material to said anode.